US 6,603,380 B2

(12) United States Patent
Tokuda et al.

(10) Patent No.: US 6,603,380 B2
(45) Date of Patent: Aug. 5, 2003

(54) METHOD OF PRODUCING LAMINATED CERAMIC ELECTRONIC COMPONENT AND LAMINATED CERAMIC ELECTRONIC COMPONENT

(75) Inventors: Hiromichi Tokuda, Takefu (JP); Tsuyoshi Tatsukawa, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/227,463

(22) Filed: Aug. 26, 2002

(65) Prior Publication Data

US 2003/0000622 A1 Jan. 2, 2003

Related U.S. Application Data

(62) Division of application No. 09/760,070, filed on Jan. 12, 2001, now Pat. No. 6,544,365.

(30) Foreign Application Priority Data

Jan. 12, 2001 (JP) ..................................... 2000-003863

(51) Int. Cl.$^7$ ............................................... H01F 27/02
(52) U.S. Cl. ........................... 336/83; 336/84; 336/200; 428/210
(58) Field of Search ............................ 336/12, 15, 60, 336/196, 200, 83, 84; 428/210

Primary Examiner—Cathy Lam
(74) Attorney, Agent, or Firm—Keating & Bennett, LLP

(57) ABSTRACT

A method of producing a laminated ceramic electronic component results in an increased thickness of an internal electrode, reduced delamination, and produces a laminated ceramic electronic component having outstanding reliability. The method of producing a laminated ceramic electronic component includes the step of forming a green sheet supported on a carrier film and having an internal electrode paste layer configured to pass through the green sheet from the upper surface to the lower surface thereof, and a ceramic paste layer, the two layers being provided with a space therebetween, and the step of repeating the step of press-bonding the laminate of the green sheet and the carrier film, and separating the carrier film to obtain a ceramic laminate, pressing the ceramic laminate in the thickness direction, and then firing the laminate to obtain a ceramic sintered body.

5 Claims, 10 Drawing Sheets

Fig. 1A
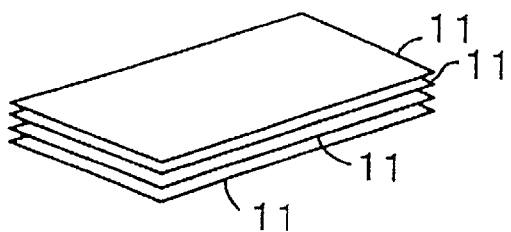
Fig. 1B
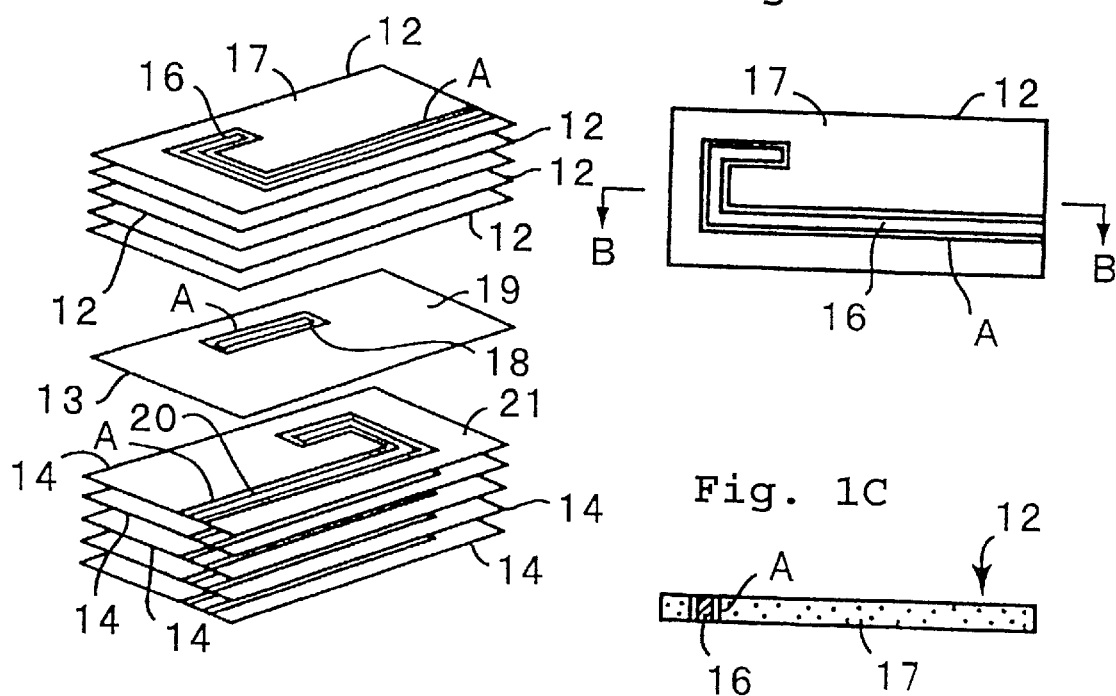
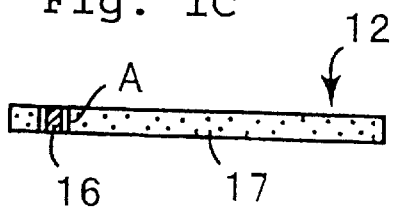
Fig. 1C
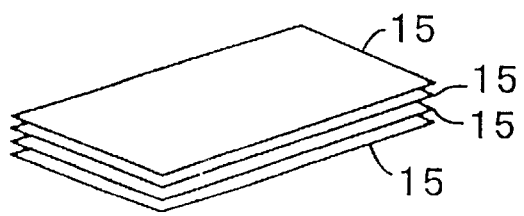

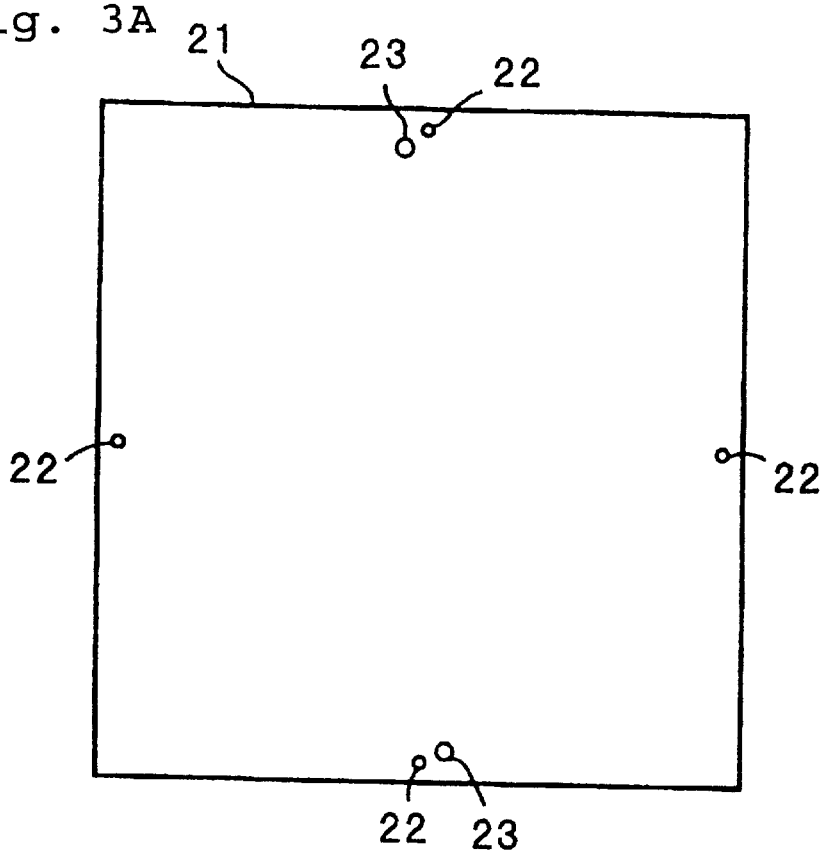
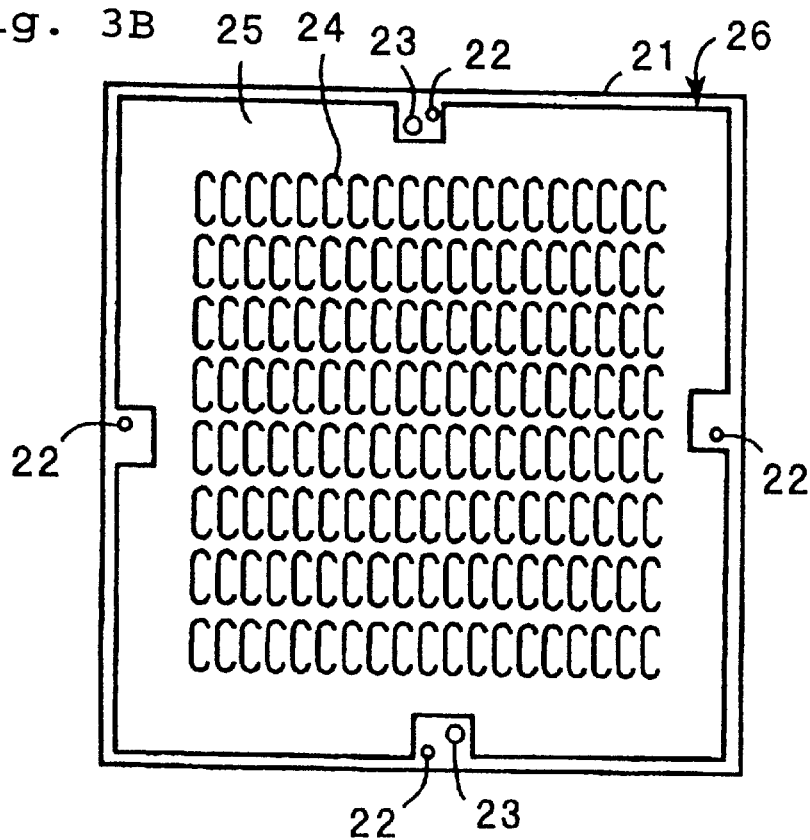

METHOD OF PRODUCING LAMINATED CERAMIC ELECTRONIC COMPONENT AND LAMINATED CERAMIC ELECTRONIC COMPONENT

This application is a Divisional of U.S. patent application Ser. No. 09/760,070 filed Jan. 12, 2001, now U.S. Pat. No. 6,544,365.

BACKGROUND OF THE INVENTION

1. Field of the Invention

The present invention relates to a method of producing a laminated ceramic electronic component defining, for example, an inductor, an LC component or a feedthrough device. More particularly, the present invention relates to a method of producing a laminated ceramic electronic component which provides internal electrodes having increased thicknesses.

2. Description of the Related Art

Conventionally, a laminated inductor having a sintered body obtained by integrally firing a metal and ceramic is known. In producing such a laminated inductor, internal electrode paste to define a coil conductor is first printed on a ceramic green sheet. Also, through holes are formed in the ceramic green sheet to electrically connect upper and lower internal electrodes. A plurality of green sheets are stacked to define a laminate body, and the resulting laminate body is pressed in the thickness direction. Then, the laminated structure is fired to obtain a ceramic sintered body, and a pair of external electrodes are formed on the outer surface of the ceramic sintered body to be electrically connected to the coil conductor.

In the laminated inductor, the number of stacked ceramic green sheets is increased to increase the number of turns, and thereby produce high inductance.

However, in the method of printing the internal electrode paste defining a coil conductor on each of the ceramic green sheets, a step between a portion having the internal electrode paste provided therein and a portion without the internal electrode paste in the resultant laminate increases as the number of stacked ceramic green sheets increases. Therefore, in pressing the laminate in the thickness direction before firing, press-bonding distortion occurs. Further, interlaminar peeling referred to as "delamination" due to the press-bonding distortion after firing also occurs.

Additionally, in the laminated inductance, the thickness or the width of a coil conductor must be increased to decrease DC resistance. However, by the method of forming an internal electrode including the coil conductor by printing the internal electrode paste on the ceramic green sheet, it is difficult to provide an internal electrode having sufficient thickness.

If an internal electrode having sufficient thickness can be provided by repeatedly printing the internal electrode paste several times, the press-bonding distortion significantly increases in pressing the laminate in the thickness direction. Therefore, interlaminar peeling often occurs in the resultant ceramic sintered body.

Furthermore, when the width of the coil conductor is increased to decrease DC resistance, the inductance value is substantially decreased.

The above-described problems occur not only in the laminated inductor but also in other laminated ceramic electronic components. That is, an increase in the number of laminated internal electrodes substantially increases press-bonding distortion when pressing in the thickness direction, thus often causing delamination. Also, an increase in the thickness of the internal electrode to decrease the DC resistance further causes the delamination.

SUMMARY OF THE INVENTION

To overcome the above-described problems with the prior art, preferred embodiments of the present invention provide a method of producing a laminated ceramic electronic component which increases the thickness of an internal electrode and decreases DC resistance, and which minimizes delamination even when the number of stacked internal electrodes is increased, and a laminated ceramic electronic component produced according to such a novel method.

Preferred embodiments of the present invention also provide a method of producing a laminated inductor which increases the thickness of a coil inductor as an internal electrode, which causes less delamination even when the number of stacked internal electrodes is increased, and which achieves a greatly increased inductance even when DC resistance is substantially decreased.

In a first preferred embodiment of the present invention, a method of producing a laminated ceramic electronic component includes the steps of printing ceramic paste on a carrier film except in a portion where an internal electrode is to be formed and the vicinity thereof, printing internal electrode paste on the portion where an internal electrode is to be formed to define a green sheet including a ceramic paste layer and an internal electrode paste layer, both of which are provided with a space therebetween, repeatedly press-bonding the laminate including the green sheet and the carrier film to another green sheet and then separating the carrier film such that the green sheets are stacked to obtain a ceramic laminate, and firing the ceramic laminate to obtain a ceramic sintered body. In this step, the other green sheets may or may not be supported by the carrier films.

In the method of producing a laminated ceramic electronic component according to the first preferred embodiment of the present invention, the ceramic paste printing step is performed either after or before the internal electrode paste printing step.

In the method of producing a laminated ceramic electronic component according to the first preferred embodiment of the present invention, the step of press-bonding the green sheet having the internal electrode paste layer provided thereon and supported by the carrier film and then separating the carrier film is repeated for a plurality of the green sheets including the internal electrode paste layers provided therein and having substantially the same shape to define an internal electrode having a thickness corresponding to the total thickness of a plurality of stacked internal electrode paste layers.

In a second preferred embodiment of the present invention, a method of producing a laminated ceramic electronic component includes the steps of providing first and second composite sheets each of which is supported by a carrier film, and each of which includes an internal electrode paste layer and a ceramic green sheet layer, which are provided with a space therebetween such that the internal paste layer passes through the ceramic green sheet from one of two main surfaces to the other of the two main surfaces, press-bonding the first composite sheet to another green sheet on a lamination stage, and then separating the carrier film, laminating the second composite sheet on the first composite sheet, press-bonding both sheets, and then separating the carrier film of the second composite sheet to define an internal electrode including a lamination of the internal electrode paste layers of the first and second composite sheets, and sintering the laminate obtained in the lamination step to obtain a ceramic sintered body.

In a third preferred embodiment of the present invention, a method of producing a laminated ceramic electronic component includes the steps of providing an electrode green sheet which is supported by a carrier film, and which includes an internal electrode for inductance configured to pass through a ceramic layer from the upper surface to the lower surface thereof, and the ceramic layer provided around the internal electrode with a space therebetween, providing a connecting electrode green sheet which is supported by a carrier film, and which includes a connecting electrode exposed from the upper and the lower surfaces of a ceramic layer, and the ceramic layer provided around the connecting electrode with a space therebetween, laminating a plurality of the electrode green sheets and the connecting electrode green sheets while separating the carrier films such that the internal electrodes for inductance are electrically connected through the connecting electrodes to define a coil to obtain a laminate, and firing the laminate to obtain a ceramic sintered body.

In the method of producing a laminated ceramic electronic component according to the third preferred embodiment of the present invention, a plurality of the electrode green sheets including the internal electrodes for inductance having substantially the same shape are laminated to define an internal electrode including a plurality of layers.

In the method of producing a laminated ceramic electronic component according to the third preferred embodiment of the present invention, in the lamination step, the carrier films are separated after press-bonding of the electrode green sheets and the connecting electrode green sheets.

In a fourth preferred embodiment of the present invention, a method of producing a laminated ceramic electronic component includes the steps of forming an electrode green sheet which is supported by a carrier film, and which includes an internal electrode for inductance configured to be exposed from the upper and lower surface of a ceramic layer, and the ceramic layer provided around the internal electrode with a space therebetween, forming a plurality of the electrode green sheets while separating the carrier films such that the internal electrodes are electrically connected to each other to define a coil conductor to obtain a laminate, and firing the laminate to obtain a ceramic sintered body.

In the method of producing a laminated ceramic electronic component in the fourth preferred embodiment of the present invention, the carrier films are separated after press-bonding of the electrode green sheets.

In the method of producing a laminated ceramic electronic component in the fourth preferred embodiment of the present invention, a plurality of the electrode green sheets including the internal electrodes for inductance having substantially the same shape are laminated to define an internal electrode including a plurality of layers.

In the method of producing a laminated ceramic electronic component in each of the first to fourth preferred embodiments of the present invention, the space may be filled with a void forming material which is burned away in subsequent firing. As the void forming material, carbon paste or a synthetic resin is used.

In a fifth preferred embodiment of the present invention, a method of producing a laminated ceramic electronic component includes the step of preparing a composite green sheet which is supported on a carrier film, and which includes an internal electrode paste layer provided to extend through a ceramic green sheet from one of two main surfaces to the other of the two main surfaces and the ceramic green sheet layer provided around the internal electrode paste layer with a space therebetween, providing a void forming green sheet which is supported on a carrier film and which includes a void forming material layer burned down in firing and configured to pass through a ceramic green sheet layer from one of two main surfaces to the other thereof and to overlap the internal electrode paste layer of the composite sheet when laminated thereon, and the ceramic green sheet provided around the void forming material layer, press-bonding the composite green sheet to another green sheet on a lamination stage and then separating the carrier film, the step of laminating the void forming green sheet on the composite green sheet, press-bonding both green sheets and then separating the carrier film to laminate the void forming material layer on the internal electrode paste layer, and repeating the lamination step, laminating unpatterned ceramic green sheets on the upper and lower surfaces of the resultant laminate, and then firing the laminate to burn down the void forming materials layers to obtain a ceramic sintered body in which a void is provided in at least one of the upper and lower surfaces of an internal electrode.

In a sixth preferred embodiment of the present invention, a method of producing a laminated ceramic electronic component includes the steps of providing a composite green sheet which is supported on a carrier film, and which includes an internal electrode for inductance configured to pass through a ceramic green sheet from the upper surface to the lower surface thereof, and the ceramic green sheet layer provided around the internal electrode for inductance with a space therebetween, providing a connecting electrode green sheet which is supported on a carrier film and which includes a void forming material layer composed of a material burned down in firing and configured to overlap the internal electrode for inductance of the composite sheet when laminated thereon and pass through the connecting electrode green sheet from the upper surface to the lower surface thereof, a connecting electrode provided at one end of the void forming material layer to be exposed from the upper and lower surfaces, and a ceramic green sheet layer provided around the void forming material layer and the connecting electrode, laminating a plurality of the composite green sheets and the connecting electrode green sheets such that the internal electrodes for inductance are electrically connected through the connecting electrodes, and the void forming material layer overlaps at least one of the upper and lower surfaces of each of the internal electrodes for inductance, and further laminating unpatterned green sheets on the upper and lower surfaces on the laminate, and firing the laminate to obtain a ceramic sintered body in which a void is provided in contact with at least one of the upper and lower surfaces of the internal electrodes for inductance, In the fifth and sixth preferred embodiments of the present invention, as the void forming material, carbon paste or a synthetic resin is preferably used.

In a seventh preferred embodiment of the present invention, a laminated ceramic electronic component includes a ceramic sintered body formed by integrally firing a plurality of ceramic layers together with an internal electrode, and the internal electrode provided in the ceramic sintered body, wherein the internal electrode has a thickness corresponding to the total thickness of the plurality of ceramic layers.

In the seventh preferred embodiment of the present invention, a gap is provided outside at least one of the upper and lower surfaces of the internal electrode.

In the laminated ceramic electronic component according to the seventh preferred embodiment of the present invention, a plurality of the internal electrodes are electrically connected in the ceramic sintered body.

In the laminated ceramic electronic component according to the seventh preferred embodiment of the present invention, the plurality of the internal electrodes are electrically connected through connecting internal electrodes.

Other features, elements, characteristics and advantages of the present invention will become more apparent from the detailed description of preferred embodiments thereof with reference to the drawings.

BRIEF DESCRIPTION OF THE DRAWINGS

FIG. 1A is an exploded perspective view illustrating green sheets, internal electrode layers, and ceramic paste layers for obtaining a laminated inductor in accordance with a preferred embodiment of the present invention;

FIG. 1B is a plan view of the green sheets, internal electrode layers, and ceramic paste layers shown in FIG. 1A;

FIG. 1C is a sectional view taken along line B—B in FIG. 1B;

FIGS. 2A and 2B are drawings illustrating a laminated inductor in accordance with a preferred embodiment of the present invention, in which FIG. 2A is a schematic perspective view showing an internal coil conductor, and FIG. 2B is a perspective view of the appearance;

FIG. 3A is a plan view illustrating a carrier film used in a first preferred embodiment of the present invention;

FIG. 3B is a plan view illustrating the state in which an internal electrode layer and a ceramic paste layer are formed on the carrier film shown in FIG. 3A;

DETAILED DESCRIPTION OF PREFERRED EMBODIMENTS

A method of producing a laminated ceramic electronic component and a laminated ceramic electronic component according to a preferred embodiment of the present invention will be described below with reference to the drawings.

A method of producing a laminated inductance according to a first preferred embodiment of the present invention will be described with reference to FIGS. 1 to 5.

Figure 2A:
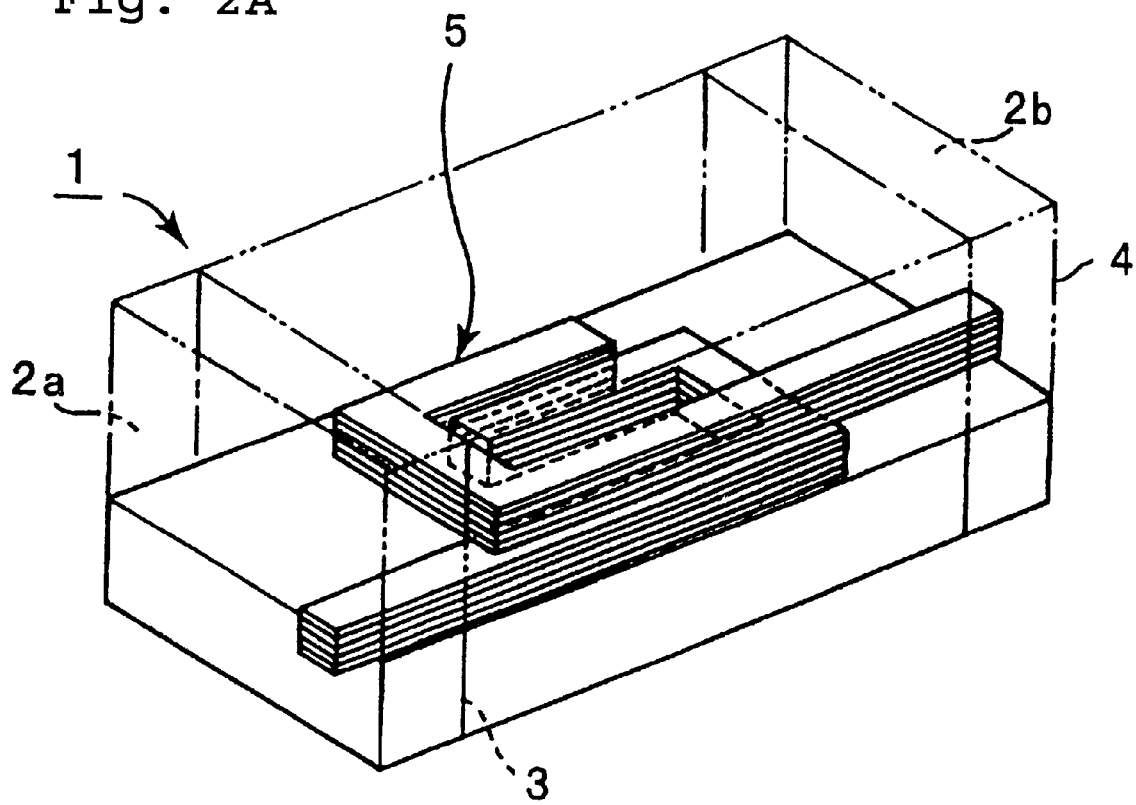
Figure 2B:
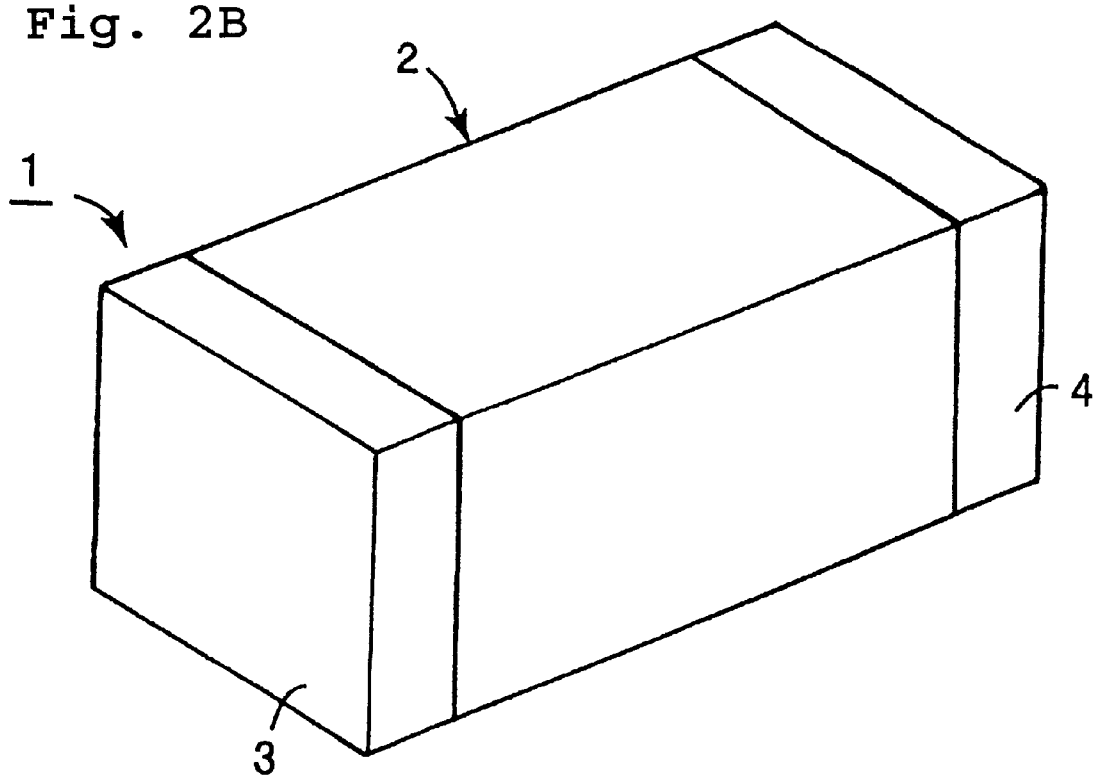

FIGS. 2A and 2B are a perspective view and an external perspective view, respectively, schematically showing the internal structure of the laminated inductor according to the first preferred embodiment of the present invention.

A laminated inductor 1 preferably includes a substantially rectangular ceramic sintered body 2. The ceramic sintered body 2 is preferably made of magnetic ceramic such as ferrite, or glass ceramic such as insulating ceramic. The magnetic ceramic is preferably used in the present preferred embodiment.

In the ceramic sintered body 2, first and second external electrodes 3 and 4 are arranged to cover the first and second end surfaces 2a and 2b, respectively. A coil conductor 5 is provided in the ceramic sintered body 2. As shown in FIG. 2A, one end of the coil conductor 5 is exposed from the end surface 2a, and electrically connected to the external electrode 3. The other end of the coil conductor 5 extends to the end surface 2b and is electrically connected to the external electrode 4.

The laminated inductor 1 of this preferred embodiment includes the coil conductor 5 having a sufficient thickness to greatly decrease DC resistance and greatly increase the inductance and current capacity. Furthermore, a space having a width of approximately 1 $\mu$m or less is provided on either side of the coil conductor, thereby further increasing the inductance. This is described in detail with reference to the method of producing the laminated inductor 1.

In producing the laminated inductor 1, as shown in FIG. 1A, green sheets 11 to 15 are laminated. In this step, the green sheets 11 and 15 are unpatterned ceramic green sheets defining uppermost and lowermost layers of the ceramic sintered body 2, and the green sheets 12 to 14 are green sheets defining ceramic layers in which internal electrode paste layers 16, 18 and 20 are provided.

As shown in FIGS. 1B and 1C, the green sheet 12 is a composite green sheet including a substantially U-shaped internal electrode paste layer 16 defining the coil conductor 5, and a ceramic paste layer 17 provided around the internal electrode paste layer 16. The internal electrode defined by an inductance paste layer 16 is configured to pass through the green sheet 12 from the upper surface to the lower surface thereof. In the green sheet 12, space A having a width of about approximately 10 $\mu$m to approximately 25 $\mu$m is provided between the internal electrode paste layer 16 and the ceramic paste layer 17. The space A is formed to ultimately define a space having a width of approximately 1 $\mu$m or less on both sides of the coil conductor 5. As shown in FIGS. 1B and 1C, since the space A is provided between the internal electrode paste layer 16 and the ceramic paste layer 17, the green sheet 12 is actually supported on a carrier film which will be described below. In laminate, the green sheet 12 is separated from the carrier film, and then laminated.

Although the internal electrode paste layer 16 and the ceramic paste layer 17 are arranged with the space A provided therebetween, both layers may be brought into partial contact due to the difficulty in forming both layers to be completely separated from one another with the space A provided therebetween.

As shown in FIG. 1A, a plurality of the green sheets 12 are laminated in the same direction. Therefore, a plurality of the internal electrode paste layers 16 are overlapped in the thickness direction to define a thick coil conductor, i.e., an internal electrode.

The green sheet 13 includes an internal electrode paste layer 18 and a ceramic paste layer 19. The internal electrode paste layer 18 preferably has a substantially rectangular shape having a short length. The internal electrode paste layer 18 is also configured to pass through the green sheet 13 from the upper surface to the lower surface thereof.

In the green sheet 13, a space A is also provided between the internal electrode paste layer 18 and the ceramic paste layer 19.

The green sheet 14 includes a substantially U-shaped internal electrode paste layer 20, and a ceramic paste layer 21. The internal electrode paste layer 20 is configured to pass through the green sheet 14 from the upper surface to the lower surface thereof, i.e., in substantially the same manner as the internal electrode paste layer 16. In this preferred embodiment, a plurality of the green sheets 14 are laminated in the same direction. Therefore, a plurality of the internal electrode paste layers 20 are laminated to define a thick coil conductor, i.e., an internal electrode.

In the green sheet 14, a space A is also provided between the internal electrode paste layer 20 and the ceramic paste layer 21.

The internal electrode paste layer 18 is arranged to define a connecting internal electrode for electrically connecting the internal electrode paste layers 16 laminated in the upper portion, and the internal electrode plate layers 20 laminated in the lower portion. Therefore, the green sheet 13 defines a connecting electrode green sheet.

In the green sheets 12 to 14, the internal electrode paste layers 16, 18 and 20 are configured to pass through the green sheets 12, 13 and 14, respectively, from the upper surface to the lower surface thereof. Therefore, these internal electrode paste layers cannot be formed by coating conductive paste on the green sheets.

In this preferred embodiment, in laminating the green sheets 11 to 15, the mother carrier film 21 shown in FIG. 3A is prepared. The carrier film 21 is preferably made of a synthetic resin such as polyethylene terephthalate or other suitable synthetic resin. In this preferred embodiment, the carrier film 21 is preferably configured to have a substantially square shape, and a printing reference hole 22 provided at the approximate center of each of the sides. The carrier film 21 also includes a lamination reference hole 23 provided near each of the printing reference hole 22.

An internal electrode paste layer 24 and a ceramic paste layer 25 are provided on the carrier film 21. In this case, a ceramic paste layer 25 is provided around the internal electrode paste layer 24 with a space therebetween (not shown).

In FIG. 3B, the internal electrode paste layer 24 is schematically shown defining a portion of the coil conductor. The internal electrode paste layer 24 corresponds to the internal electrode paste layers 16, 18 and 20, and has a shape corresponding to the planar shape of the intended internal electrode paste layer. After the internal electrode paste layer 24 is provided, the ceramic paste layer 25 is then provided around the internal electrode paste layer 24 with a space therebetween.

After the ceramic paste slayer 25 is provided, the internal electrode paste layer 24 is configured with a space from the ceramic paste layer.

Figure 4A:
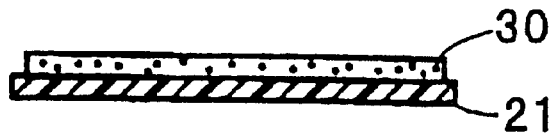
FIGS. 4A to 4C are sectional views respectively illustrating the steps for laminating green sheets each supported by a carrier film in a preferred embodiment of the present invention.

As described above, a green sheet 26 is supported by the carrier film 21 (FIG. 4A).

As shown in FIG. 4A, a mother green sheet 30 supported by the carrier film 21 as described above is provided to obtain the green sheets 11 and 13 in each of which the internal electrode paste layer is not provided.

Figure 4B:
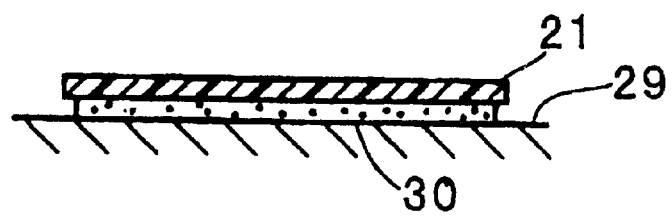

Next, as shown in FIG. 4B, a lamination stage 29 is provided. Then, the green sheet 30 supported by the carrier film 21 is placed on the lamination stage 29 with the green sheet 30 facing downward. The green sheet 30 includes only ceramic paste and no internal electrode paste layer. In this step, the green sheet 30 is positioned while reading the lamination reference holes 23 with a camera (not shown).

Then, the green sheet 30 is press-bonded from the outside of the carrier film 21, and then the carrier film 21 is separated from the green sheet 30.

Figure 4C:
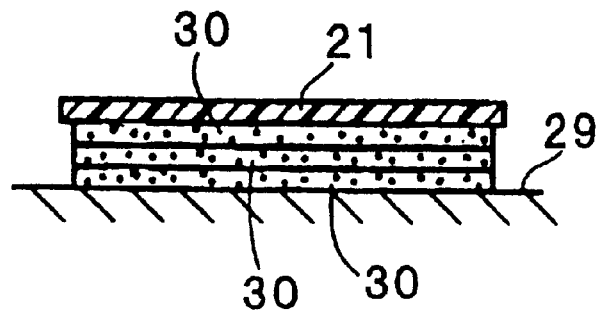

As described above, a plurality of the components in which the green sheet 30 is supported by the carrier film 21 are repeatedly laminated, and then press-bonded to laminate a plurality of the mother green sheets 30, as shown in FIG. 4C.

Figure 5A:
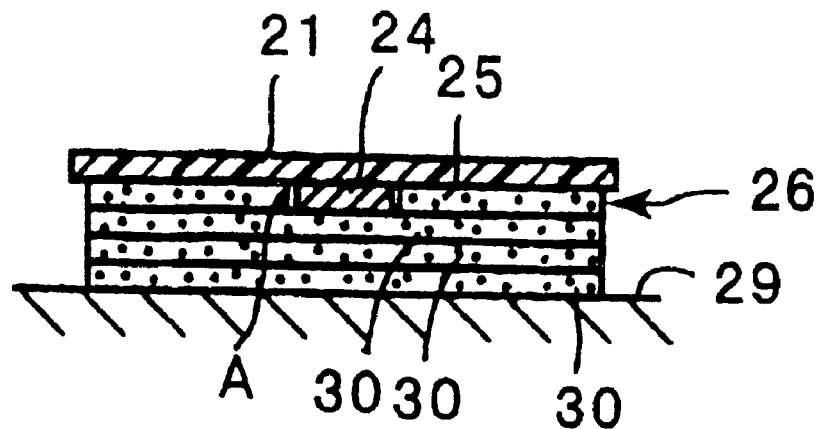
FIGS. 5A and 5B are sectional views respectively illustrating the steps for laminating green sheets each supported by a carrier film in a preferred embodiment of the present invention.
Figure 5B:
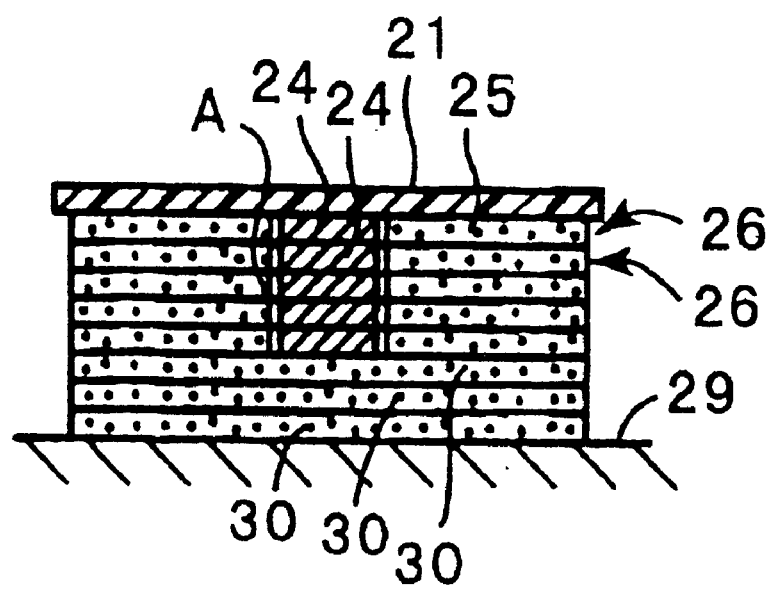

Furthermore, as shown in FIGS. 5A and 5B, a plurality of the green sheets 26, each of which is supported by the carrier film 21 and includes the internal electrode paste layer 24 and the ceramic paste layer 25 provided with the space therebetween, are laminated by the same method as described above.

In this manner, a plurality of the green sheets are laminated, and the resultant laminate is pressed in the thickness direction to obtain a laminate. The obtained mother laminate is cut in the thickness direction to obtain laminates of respective laminated inductor units. Each of the laminates is fired to obtain the ceramic sintered body 2.

Therefore, the green sheets 12, 13 and 14 having the internal electrode paste layers 16, 18 and 20, respectively, which are provided to pass through the green sheets from the upper surface to the lower surface thereof, are handled in a state supported by the carrier film 21, and laminated as described above to easily obtain the laminate to produce the ceramic sintered body 2 shown in FIG. 2.

Regarding FIG. 2, in the laminated inductor 1 of this preferred embodiment, the ceramic sintered body 2 including the coil conductor 5 is easily obtained by integrally firing a laminated ceramic, as described above. The coil conductor 5 includes the internal electrode paste layers 16 and 20 which are formed to pass through the green sheets 12 and 24, respectively, from the upper surface to the lower surface thereof. Furthermore, a plurality of each of the internal electrode paste layers 16 and 20 are laminated such that the thick coil conductor 5 is easily obtained. Therefore, greatly improved inductance and current capacity is achieved.

Furthermore, the space A is provided on both sides of each of the internal electrode paste layers 16, 18 and 20 such that the space is provided on both sides of the coil conductor 5 in the resultant ceramic sintered body 2, thereby further increasing the inductance. As a result, in the laminated inductor obtained by integrally firing the internal electrode and ceramic, residual stress occurs due to the difference in the thermal expansion coefficients of the internal electrode and the ceramic, thereby decreasing the initial magnetic permeability ($\mu i$) of magnetic ceramic. The magnetic permeability $\mu i$ is represented by $\mu i = AMs^2/aK_1 + b\lambda_s \cdot \sigma)$.

In the above equation, A, a and b are constants, Ms represents the saturation magnetic flux density, $K_1$ represents the crystal magnetic anisotropic constant, $\lambda_s$ represents the magnetostrictive constant, and $\sigma$ represents stress.

The equation indicates that in order to realize a high initial magnetic permeability $\mu i$, the stress applied to a magnetic material must be minimized. In this preferred embodiment, by providing the space A, the stress applied to the ceramic is substantially decreased to further increase the inductance, as described above.

Furthermore, since the internal electrode paste layers 16 and 20, which define the coil conductor 5, preferably have substantially the same thickness as the green sheets 12 and 14, respectively, press-bonding distortion is greatly decreased in pressing the mother laminate in the thickness direction. Thus, the occurrence of delamination in the ceramic sintered body 2 is prevented.

In the first preferred embodiment, a material such as carbon paste or other suitable material, which is scattered during firing, is coated on the upper surface of the uppermost internal electrode paste layer 16. In this case, a space is also provided in upper surface of the uppermost internal electrode paste layer 16 to increase the inductance. Similarly, carbon paste or other suitable material may be coated on the lower surface of the lowermost internal electrode paste layer.

Figure 6A:
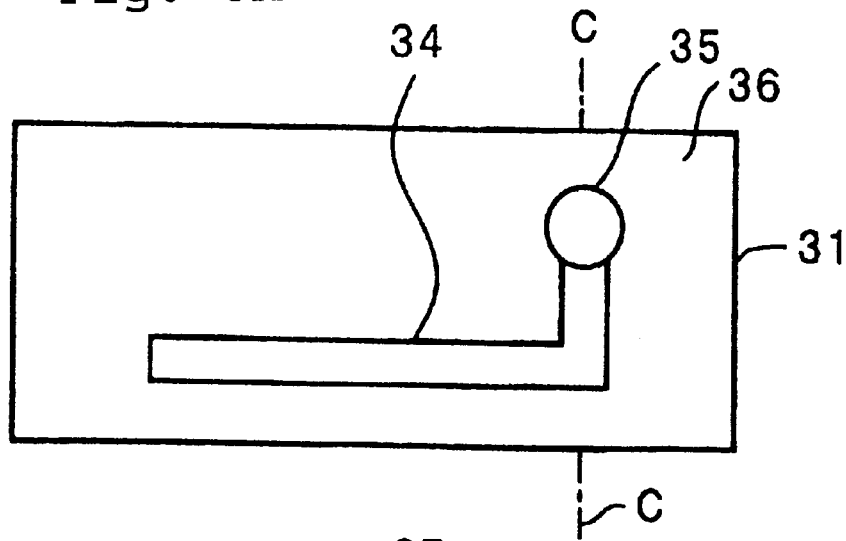
FIGS. 6A to 6C are plan views respectively showing composite green sheets and a connecting electrode green sheets prepared in a production method in accordance with a second preferred embodiment of the present invention.
Figure 6B:
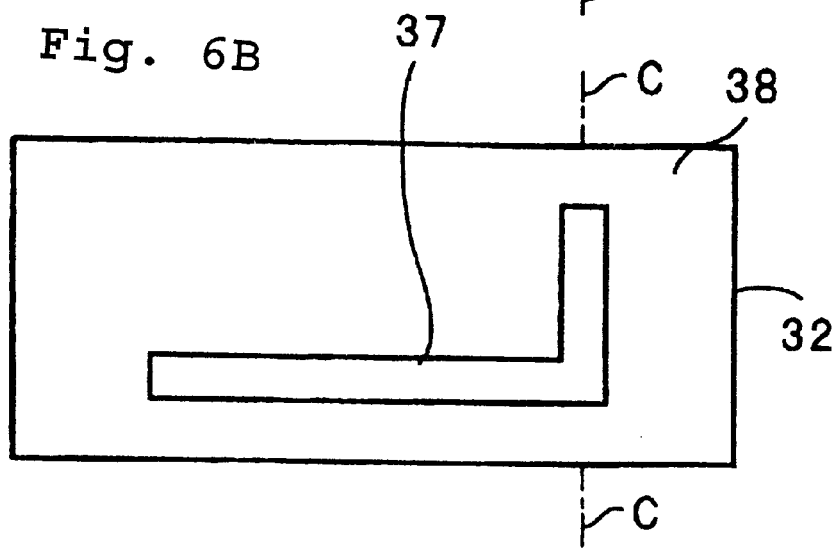
Figure 6C:
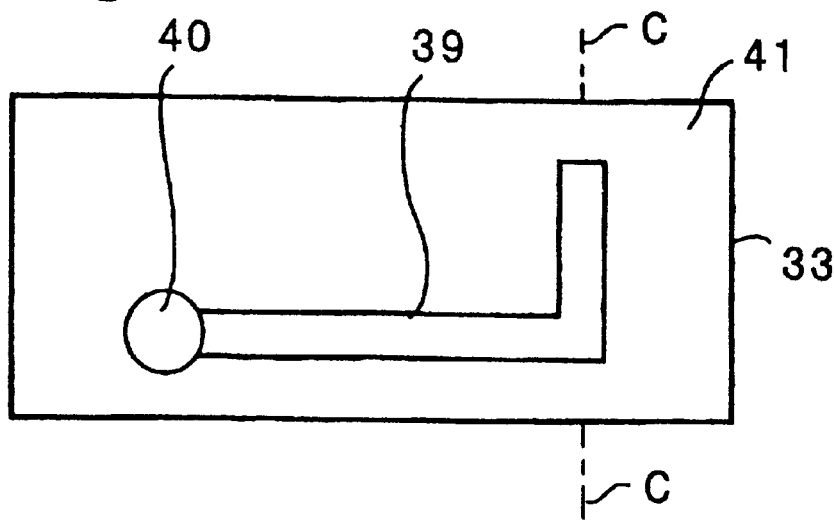
Figure 7:
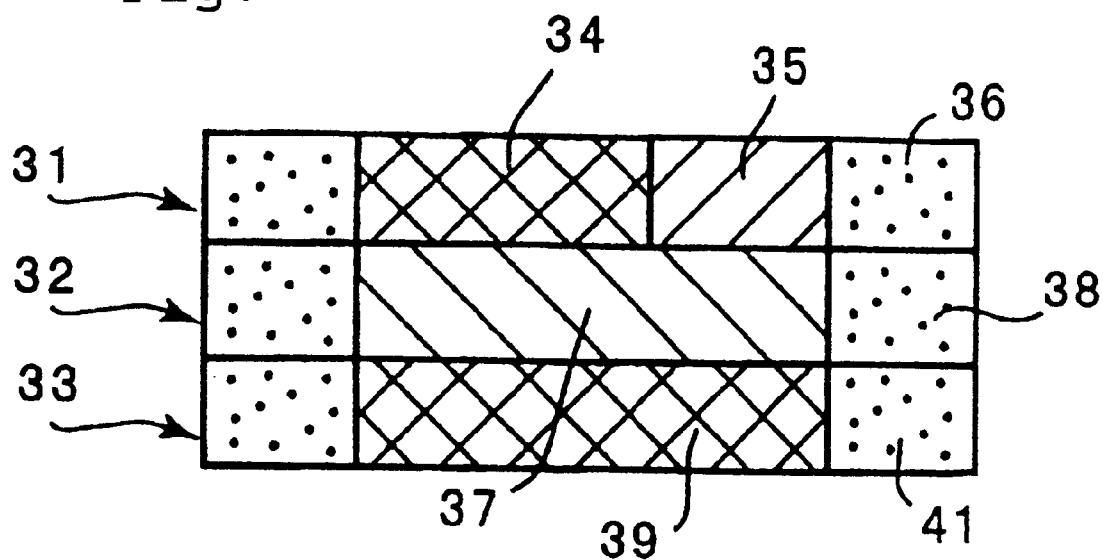
FIG. 7 is a sectional view showing a portion where the composite green sheets and a connecting electrode green sheets are laminated in the production method in accordance with the second preferred embodiment of the present invention.

FIGS. 6 and 7 are drawings illustrating the method of producing a laminated inductor according to a second preferred embodiment of the present invention.

Although, in the first preferred embodiment, the space A is provided on the sides of the coil conductor, i.e., both sides thereof, a space may be provided above and below the internal electrode in a laminated ceramic electronic component of the present invention.

In the second preferred embodiment, to provide the space above and below the internal electrode, the ceramic green sheets 31 to 33 shown in FIGS. 6A to 6C are laminated. In fact, green sheets having other internal electrode paste layers provided therein are further laminated above and below the ceramic green sheets 31 to 33 in order to define the coil conductor.

In the connecting electrode green sheet 31 shown in FIG. 6A, a substantially L-shaped carbon paste layer 34 is provided, and an internal electrode paste layer 35 defining a connecting electrode is provided at one end of the carbon paste layer 34. In addition, a ceramic green sheet layer 36 is provided around the carbon paste layer 34 and the internal electrode paste layer 35.

In the composite green sheet 32 shown in FIG. 6B, a ceramic green sheet 38 is provided around a substantially L-shaped internal electrode paste layer 37. The internal electrode providing the inductance paste layer 37 has substantially the same shape as the carbon paste layer 34 and is arranged such that the carbon paste layer 34 overlaps the internal electrode paste layer 37 when the green sheets 31 and 32 are laminated. The internal electrode paste layer 35 defining the connecting electrode is arranged to overlap the internal electrode paste layer 37.

In the connecting electrode green sheet 33 shown in FIG. 6C, a ceramic green sheet 41 is provided around a substantially L-shaped carbon paste layer 39 and an internal electrode paste layer 40 functioning as a connecting electrode. The carbon paste layer 39 and the internal electrode paste layer 40 are arranged to overlap the internal electrode paste layer 37 when the ceramic green sheet 33 is laminated below the ceramic green sheet 32.

The internal electrode paste layer 40 overlaps the internal electrode paste layer 37 at the long side end of the internal electrode paste layer 37 when the green sheets 31 to 33 are laminated, and the internal electrode paste layer 35 overlaps the internal electrode paste layer 37 at the short side end of the internal electrode paste layer 37.

In the green sheets 31 to 33, the internal electrode paste layers 35, 37 and 40 are arranged to pass through the green sheets 31, 32, and 33, respectively, from the upper surface to the lower surface thereof. As a result, these internal electrode-paste layers have a sufficient thickness. Similarly, the carbon paste layers 34 and 39 have a sufficient thickness such that the carbon paste layers pass through the green sheets 31 and 33, respectively, from the upper surface to the lower surface thereof.

FIG. 7 is a sectional view showing the state in which the green sheets 31 to 33 are laminated. FIG. 7 is a sectional view taken along line C—C in FIGS. 6A to 6C. In this laminate, the carbon paste layers 34 and 39 are laminated above and below the internal electrode paste layer 37, and the internal electrode paste layer 35 is connected to one end of the internal electrode paste layer 37. Although not shown in FIG. 7, the other end of the internal electrode paste layer 37 is electrically connected to the internal electrode paste layer 40.

Therefore, the internal electrode defining the inductance paste layers 37 are further laminated above and below the laminate through the internal electrode plate layers 35 and 40 serving as connecting electrodes to define the same coil conductor as the first preferred embodiment. In the second preferred embodiment, like in the first preferred embodiment, both ends of the coil conductor extend to the ends of the ceramic sintered body.

Therefore, the green sheets 31 to 33, and composite green sheets to define the coil conductor are laminated, and unpatterned ceramic green sheets are laminated at the top and the bottom, followed by pressing in the thickness direction to obtain a laminate defining the laminated inductor of the second preferred embodiment. In obtaining the laminate, the internal electrode paste layers 35, 37 and 40 are configured to pass through the composite green sheets from the upper surface to the lower surface thereof. As a result, the thicknesses of the electrode defining portion and the other portion are greatly reduced, thereby decreasing press bonding distortion. Therefore, like in the first preferred embodiment, the occurrence of delamination in the resultant ceramic sintered body is prevented.

In the laminated inductor of the second preferred embodiment, the carbon paste layers 34 and 39 are burned out during firing. Therefore, a space is provided above and below the internal electrode defined by compaction of the internal electrode paste layer 37. Like the first preferred embodiment, the formation of the spaces is effective to greatly increase inductance.

In the second preferred embodiment, the internal electrode paste layer 37, which defines the coil conductor, has a thickness corresponding to the thickness of the green sheet 32. Thus, a greatly increased inductance and current capacity is achieved, and the DC resistance is greatly decreased.

In the second preferred embodiment, as in the first preferred embodiment, a plurality of the internal electrode paste layers 37, which define a portion of the coil conductor, are laminated directly together, and the green sheets 31 and 33 are laminated to provide the upper and lower spaces to produce a coil conductor having a larger thickness. The inductance is substantially increased via this method.

Although, in the first preferred embodiment, the space A is provided on both sides of the internal electrode, a space may further be provided above and below the internal electrode according to the second preferred embodiment in combination with the first preferred embodiment. In other words, in the laminated inductor of the first preferred embodiment, like in the second preferred embodiment, the space may be provided above and below the internal electrode, or in the laminated inductor of the second preferred embodiment, like in the first preferred embodiment, the space A may be provided on both sides of the internal electrode.

Although, in the first preferred embodiment, as shown in FIGS. 1B and 1C, the internal electrode paste layer and the ceramic paste layer are configured with the space A provided therebetween, the space between both layers may be filled with a void forming material which burns out during firing. As a void forming material, a carbon paste or synthetic resin used in the second preferred embodiment may be used.

In the second preferred embodiment, a synthetic resin other than the material of the carbon paste layer may be used for the void forming material.

Figure 8:
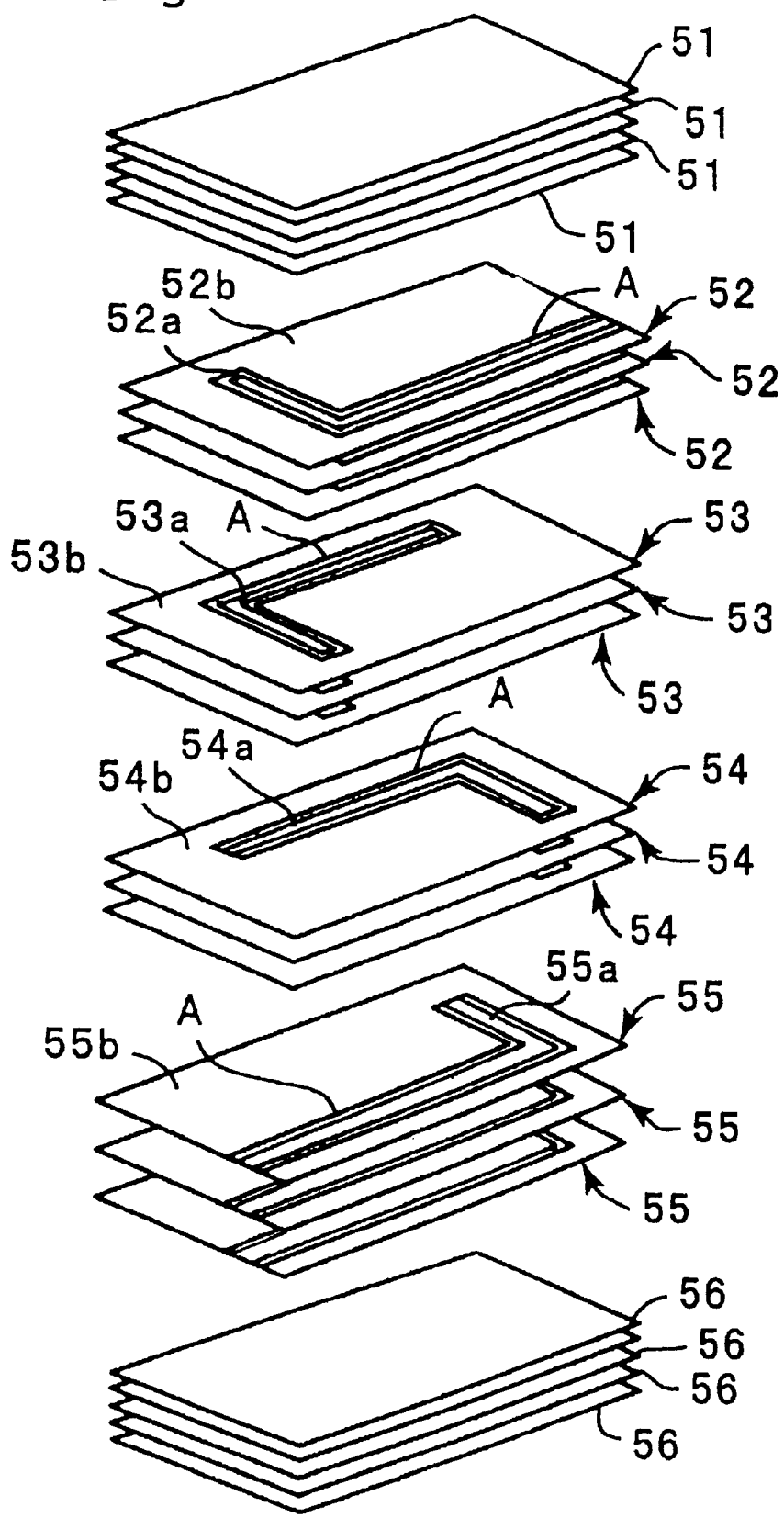
FIG. 8 is an exploded perspective view illustrating a method of producing a laminated inductor according to a modified preferred embodiment of the present invention.
Figure 9:
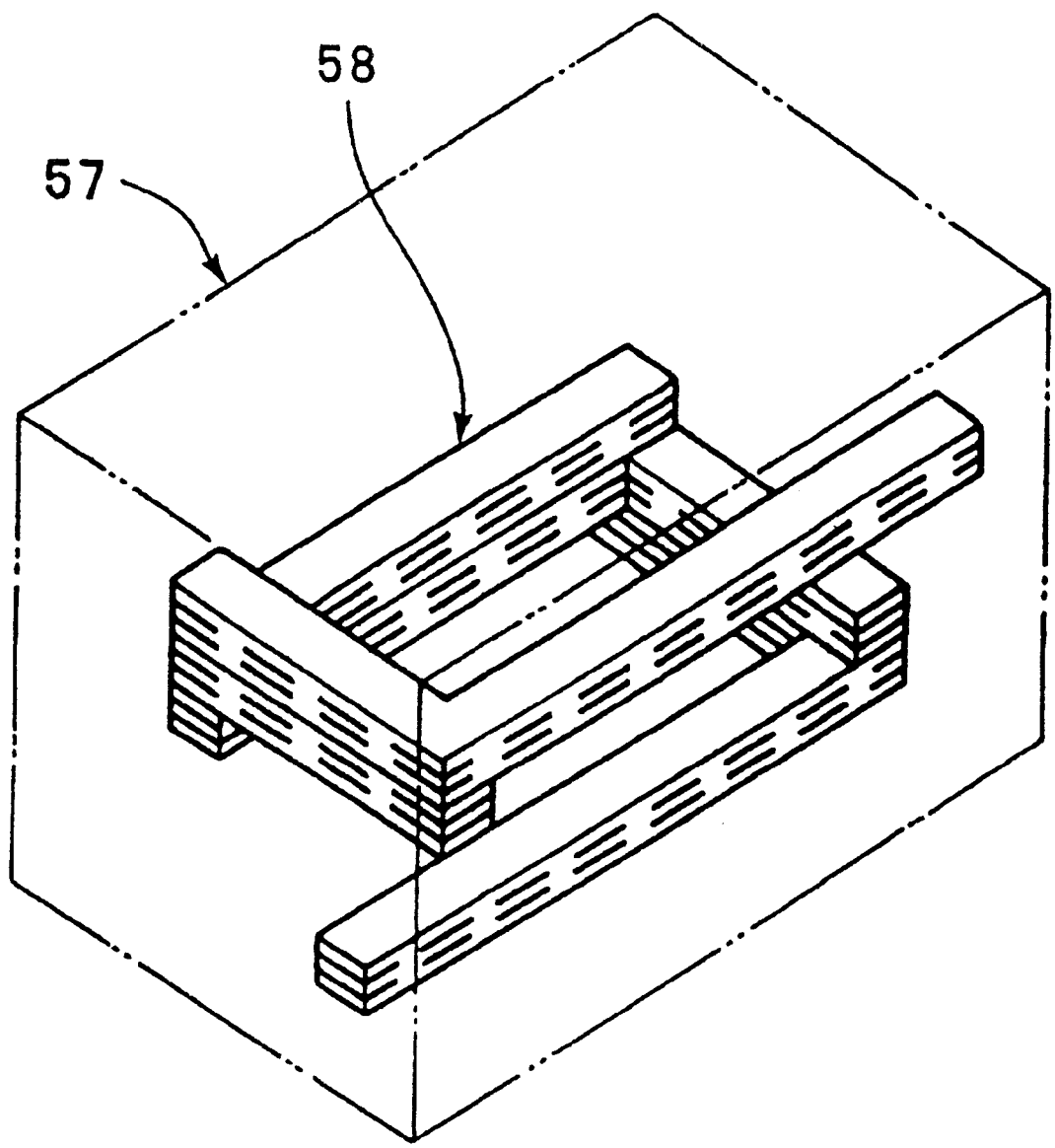
FIG. 9 is a schematic perspective view illustrating an internal coil conductor of a ceramic sintered body obtained by laminating a plurality of the green sheets shown in FIG. 6 and then firing the laminate.

FIGS. 8 and 9 are drawings illustrating a laminated inductor in accordance with a modified embodiment of the first preferred embodiment.

In this modified embodiment, as shown in FIG. 8, ceramic green sheets 51 to 56 are stacked. Each of the ceramic green sheets 51 and 56 includes a ceramic paste layer without an internal electrode paste layer. The green sheets 52 to 55 include internal electrode paste layers 52a to 55a, and ceramic paste layers 52b to 55b, respectively, which are provided with space A therebetween. As shown in FIG. 8, a plurality of each of the green sheets 52 to 55 are laminated. Therefore, a plurality of each of the internal electrode paste layers 52a to 55a are laminated.

Furthermore, in laminating the internal electrode paste layers 52a to 55a as shown in FIG. 8, one end portion of a upper internal electrode paste layer is brought into contact with one end portion of a lower internal electrode paste layer such that both portions overlap each other on one side. For example, as shown in FIG. 8, of the plurality of the green sheets 52, the internal electrode paste layer 52a of the lowermost green sheet 52 is laminated on the internal electrode paste layer 53a of the lower green sheet 53 such that both layers overlap each other on one side of a substantially rectangular coil circuit.

Like in the first preferred embodiment, the green sheets 51 to 56 are stacked, and then pressed in the thickness direction to obtain the ceramic sintered body 57 schematically shown in FIG. 9. In the ceramic sintered body 57, a coil conductor 58 is provided. The coil conductor 58 is made by baking the internal electrode paste layers 51a to 55a to form a coil circuit having a substantially rectangular shape. As described above, the coil conductor of the upper portion and the coil conductor of the lower portion are connected to be directly overlapped in the thickness direction, thereby increasing the reliability of the electric connection between the respective coil conductor portions.

In the laminated inductor of this modified embodiment, a space defined by the space A is provided on both sides of the coil conductor, whereby an increased inductance is obtained as in the first preferred embodiment.

In the method of producing the laminated inductor according to the modified embodiment of the present invention shown in FIGS. 8 and 9, a connecting internal electrode paste layer is not necessarily provided.

In the laminated inductor of the modified embodiment shown in FIGS. 8 and 9, the thickness of the coil conductor 58 can be increased to obtain an increased inductance, and less press-bonding distortion occurs in the ceramic sintered body 57 to prevent delamination.

Although, in the first preferred embodiment and the modified embodiment, a plurality of the internal electrode paste layers having the same pattern are stacked to define the thick coil conductor, an internal electrode paste layer, which defines a portion of the coil conductor, may include a single layer. For example, in the first preferred embodiment, only one each of the green sheets is used such that a coil conductor includes one internal electrode paste layer 16, an internal electrode paste layer 18 as a connecting electrode, and one internal electrode paste layer 20. Even in this case, a coil conductor having substantially the same thickness as the total thickness of the green sheets is obtained. Thus, a thick coil conductor is easily provided, which has lower inductance than the first preferred embodiment and the modified embodiment, but a larger thickness than a conductor formed by the conventional method of coating once on conductive paste on a green sheet. Such a construction may also be included within certain preferred embodiments of the present invention.

Figure 10:
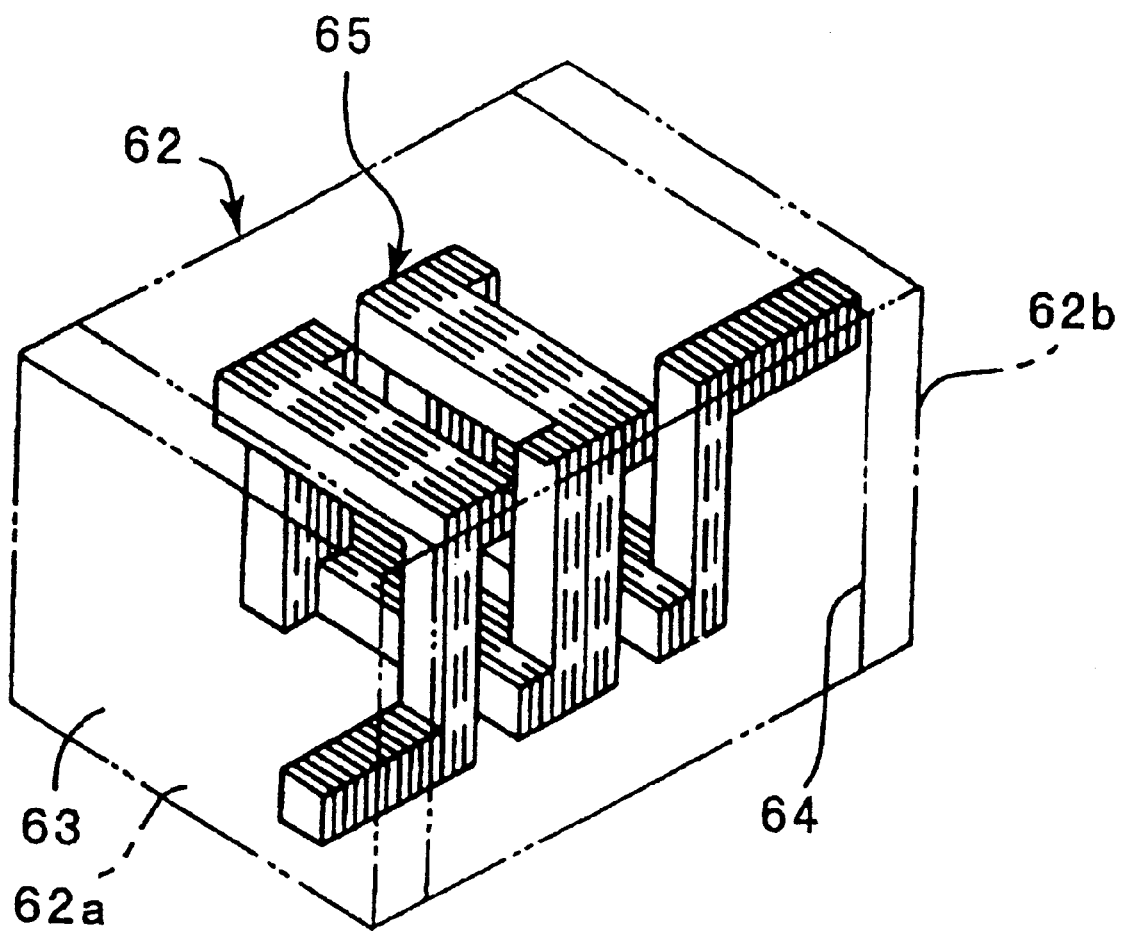
FIG. 10 is a schematic perspective view illustrating a laminated inductor according to another modified preferred embodiment of the present invention.

In the first preferred embodiment, the external electrodes 3 and 4 are provided on the end surfaces 2a and 2b of the ceramic sintered body 2, and the coil conductor 5 is wound from the upper surface 2c to the lower surface 2d. However, a so-called transverse coil-type laminated inductor 41 may be provided, in which external electrodes 63 and 64 are provided on the end surfaces 62a and 62b of a ceramic sintered body 62, and a coil conductor is wound from the end surface 62a to the end surface 62b, as shown in FIG. 10.

Although, in the first preferred embodiment and the modified embodiment, the method of producing the laminated inductor is described, the present invention can also be used for producing not only the laminated inductor but also other laminated ceramic electronic components such as a laminated varistor, a laminated thermistor, a laminated capacitor, and other suitable components. More specifically, by producing each of various laminated ceramic electronic components, press-bonding distortion is greatly decreased in pressing a laminate in the thickness direction before firing, thereby obtaining a laminated ceramic electronic component causing less delamination and having excellent reliability. Also, the thickness of the internal electrode is substantially increased to permit a greatly increased inductance and current capacity.

In the method of producing a laminated ceramic electronic component in accordance with the first preferred embodiment of the present invention, a green sheet is provided, in which an internal electrode paste layer is provided in the internal electrode forming portion, and a ceramic paste layer is provided in the other portion. More specifically, an internal electrode is configured to pass through the green sheet from the upper surface to the lower surface thereof, and when a laminate obtained by stacking a plurality of the green sheets is burned to obtain a ceramic sintered body, the thickness of the internal electrode is substantially increased as compared with a conventional laminated ceramic electronic component including an internal electrode formed by printing conductive paste on each of green sheets. Therefore, inductance and a current capacity are substantially increased, and DC resistance greatly decreased.

In addition, a space is provided on both sides of the internal electrode to further increase the inductance.

Furthermore, in the green sheet, the portion where the internal electrode is provided and the ceramic paste layer have the same thickness, thereby causing less press-bonding distortion when the laminate is pressed in the thickness direction before firing. Therefore, in the laminated ceramic electronic component, the occurrence of delamination is effectively prevented, thereby obtaining a laminated ceramic electronic component having excellent reliability.

The ceramic paste printing step may be performed before or after the internal electrode paste printing step.

In the production method of preferred embodiments of the present invention, when the step of press-bonding the green sheet supported by the carrier film, and then separating the carrier film is repeated several times for the same green sheets, an internal electrode having a larger thickness is provided, in which a plurality of internal electrode paste layers are laminated.

In the method of producing a laminated ceramic electronic component in accordance with the second preferred embodiment of the present invention, first and second composite sheets supported by carrier films are prepared, each of which includes an internal electrode configured to pass through a ceramic green sheet from one of both main surfaces to the other, and the ceramic green sheet. The first composite sheet is press-bonded, the carrier film is separated, the second composite sheet is laminated on the first composite sheet, and then press-bonded, and then the carrier film of the second composite sheet is separated to form an internal electrode by lamination of the internal electrode layers of the first and second composite sheets. Therefore, an internal electrode having a substantially increased thickness is provided, thereby greatly decreasing DC resistance.

In addition, a space is provided on both sides of the internal electrode to obtain an increased inductance. Furthermore, in the laminate obtained in the lamination step, the portion where the internal electrode is provided, and the other portion have substantially the same thickness, thereby causing much less press-bonding distortion when the laminate is pressed in the thickness direction before firing. Therefore, a laminated ceramic electronic component causing much less delamination and having excellent reliability is obtained.

In the method of producing a laminated ceramic electronic component in accordance with a third preferred embodiment of the present invention, an electrode green sheet defined by a carrier film and including an internal inductance electrode configured to pass through the green sheet from the upper surface to the lower surface thereof, and a connecting electrode green sheet supported on a carrier film and including a connecting electrode configured to be exposed from the upper and lower surfaces of the green sheet are provided. A plurality of the internal electrodes for inductance are electrically connected through the connecting electrodes to define a coil conductor. Therefore, as in the first and second preferred embodiment of the present invention, the internal inductance electrode is configured to pass through each of the green sheets from the upper surface to the lower surface thereof. Therefore, the thickness of the coil conductor is increased to substantially decrease the DC resistance, and thus, a high inductance is obtained.

In addition, a space is provided on both sides of the coil conductor to further increase the inductance.

Furthermore, in the green sheet, the portion where the internal electrode is provided and the other portion have substantially the same thickness, thereby producing less press-bonding distortion when the laminate is pressed in the thickness direction before firing. Therefore, a laminated ceramic electronic component producing less delamination and having outstanding reliability is achieved.

In the third preferred embodiment of the present invention, when a plurality of green sheets having the internal inductance electrodes having substantially the same shape are laminated, an internal electrode including a plurality of layers is provided to produce a laminated inductor having substantially increased inductance.

In the third preferred embodiment of the present invention, by press-bonding the electrode green sheet and the connecting electrode green sheet, and then separating the carrier films, a composite sheet including the internal electrode and the connecting electrode, and handling of the ceramic layer is greatly facilitated, thereby permitting stable lamination.

In the method of producing a laminated ceramic electronic component in accordance with the fourth preferred embodiment of the present invention, a plurality of electrode green sheets each including a ceramic layer provided around an internal inductance electrode are laminated to obtain a laminate in which the internal electrodes are electrically connected to define a coil conductor. Therefore, as in the first to third preferred embodiment of the present invention, a thick internal electrode, i.e., a thick coil conductor, is provided, thereby decreasing DC resistance, and obtaining an increased inductance.

In the step of pressing in the thickness direction before firing, a substantially decreased amount of press-bonding distortion occurs, and thus a laminated inductor producing much less delamination and having excellent reliability is provided.

In the fourth preferred embodiment of the present invention, the carrier film is separated after each of the electrode green sheets is press-bonded, and thus the electrode green sheets are easily handled.

In the fourth preferred embodiment of the present invention, when a plurality of the electrode green sheets including the internal inductance electrodes having the same shape are laminated directly, an internal inductance electrode including a plurality of layers is provided to further increase the thickness of the coil conductor, whereby higher inductance is easily obtained.

Furthermore, a space is formed on both sides of the coil conductor to further increase the inductance.

In the first to fourth preferred embodiment of the present invention, when a space is filled with a void forming material in the unburned step to form the space, the space is not formed in a laminate state, and thus the laminate is compacted by pressing, thereby finally obtaining a compact sintered body.

When using carbon paste or a synthetic resin as the void forming material, the material is burned down in firing the ceramic to securely form the space.

In the method of producing a laminated ceramic electronic component in accordance with the fifth preferred embodiment of the present invention, a void forming green sheet is laminated on a composite green sheet, and thus a void forming material is burned down to define a space above and/or below an internal electrode in the final resultant sintered body. Therefore, for example, in producing a laminated inductor, a greatly increased inductance is obtained. In the method of producing a laminated ceramic electronic component in accordance with the fifth preferred embodiment of the present invention, an internal electrode paste layer is configured to pass through a composite green sheet from the upper surface to the lower surface thereof, and thus an internal electrode having an increased thickness is obtained to substantially decrease DC resistance, and greatly increase inductance and a current capacity. In addition, less press-bonding distortion occurs in press bonding after lamination, and thus a laminated inductor having greatly decreased delamination and having excellent reliability is provided.

In the method of producing a laminated ceramic electronic component in accordance with the sixth preferred embodiment of the present invention, a composite green sheet is provided, in which an internal inductance electrode is provided to pass through the green sheet from the upper surface to the lower surface thereof. Therefore, the thickness of the internal electrode for inductance is increased to substantially decrease the DC resistance, and obtain substantially increased inductance and current capacity. In addition, a connecting electrode green sheet having a void forming material layer is laminated to overlap the internal inductance electrode such that a space is provided in contact with at least one of the upper and lower surfaces of the internal electrode for inductance in the final resultant sintered body. Therefore, the formation of the space is achieved having an increased inductance.

In the production method in the sixth preferred embodiment of the present invention, greatly reduced press-bonding distortion occurs in pressing the laminate, and thus greatly reduced delamination occurs.

Therefore, a laminated inductor having outstanding reliability and increased inductance is achieved.

If carbon paste or a synthetic resin is used as the void forming material, the material is easily burned down in firing ceramic to securely provide the space.

In a laminated ceramic electronic component of a preferred embodiment of the present invention, an internal electrode provided in a ceramic sintered body has a thickness corresponding to the total thickness of a plurality of ceramic layers, thereby increasing the inductance and current capacity.

When a plurality of internal electrodes are electrically connected directly with each other in a ceramic sintered body, only a green sheet including an internal electrode provided therein is provided, thereby obtaining a laminated ceramic electronic component having substantially increased inductance and current capacity and reduced DC resistance.

In the laminated ceramic electronic component of the present invention, when a plurality of internal electrodes are electrically connected through connecting internal electrodes, coil conductors having various coil patterns are effectively provided.

While preferred embodiments of the present invention have been described, it is to be understood that modifications will be apparent to those skilled in the art without departing from the scope and spirit of the invention.

What is claimed is:

1. A laminated ceramic electronic component comprising:
   a ceramic sintered body obtained by integrally firing a plurality of ceramic layers together with an internal electrode; and
   the internal electrode provided in the ceramic sintered body;
   wherein a space is formed around any one of the upper surface, the lower surface, and the sides of the internal electrode.

2. A laminated ceramic electronic component according to claim 1, wherein a space is provided outside at least one of the upper and lower surfaces of the internal electrode.

3. A laminated ceramic electronic component according to claim 1, wherein the plurality of the internal electrodes are electrically connected within the ceramic sintered body.

4. A laminated ceramic electronic component according to claim 3, wherein the plurality of the internal electrodes are electrically connected via connecting internal electrodes.

5. A laminated ceramic electronic component according to claim 1, wherein the internal electrode includes a coil conductors which is laminated in the ceramic sintered body.

* * * * *